March 31, 1964 J. C. FREEBORN 3,127,575
TRANSISTOR MULTIVIBRATOR WITH SATURABLE CORE TIMING MEANS
Filed Sept. 18, 1961

TUNNEL DIODE CHARACTERISTIC

INVENTOR.
JOHN C. FREEBORN
BY
Osmund R. Dahle
ATTORNEY

United States Patent Office 3,127,575
Patented Mar. 31, 1964

3,127,575

TRANSISTOR MULTIVIBRATOR WITH SATURABLE CORE TIMING MEANS

John C. Freeborn, Azusa, Calif., assignor to Minneapolis-Honeywell Regulator Company, Minneapolis, Minn., a corporation of Delaware Filed Sept. 18, 1961, Ser. No. 138,721
6 Claims. (Cl. 331—113)

This invention relates to a precision low frequency transistor-magnetic oscillator circuit having a high degree of stability under widely varying operating conditions.

An object of this invention is to provide an improved semiconductor-magnetic very low frequency oscillator which is exceptionally rugged, highly reliable, virtually insensitive to shock and possessing a long shelf life capability.

Figure 1:
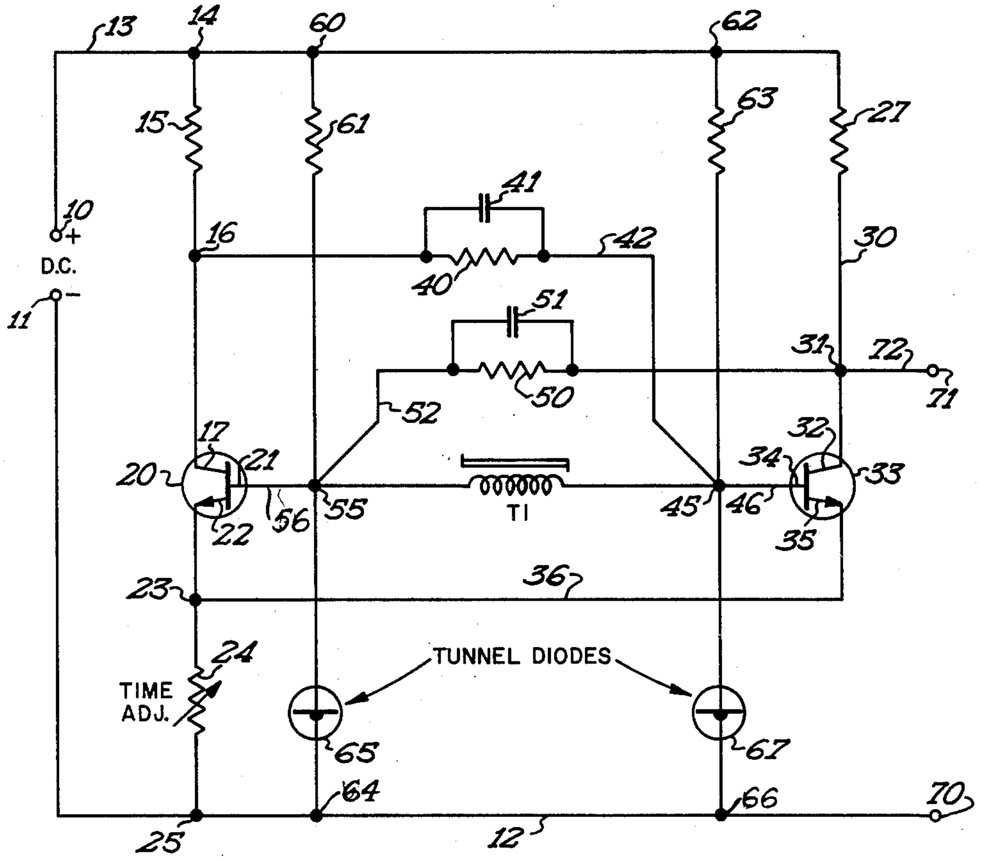
Figure 2:
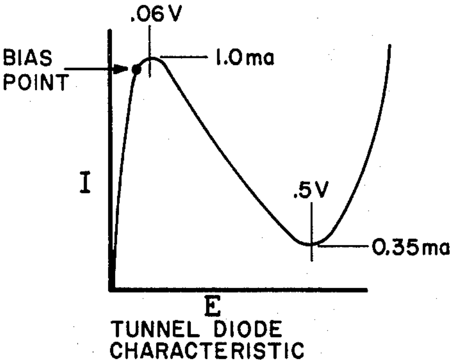

This and other objects of the present invention will become more apparent on a consideration of the accompanying specification, claims and drawings of which:

FIGURE 1 is a schematic diagram of a preferred embodiment circuit of the invention; and, FIGURE 2 is a graph of operating characteristics of tunnel diodes used in the circuit of the invention.

Referring now to FIGURE 1 there is a disclosed pair of input terminals 10 and 11 which are intended to be connected to a suitable source of direct current energy with the terminal 10 being positive with respect to terminal 11. The negative terminal 11 is connected to a conductor 12 and the positive terminal 10 is connected to a conductor 13. From a junction 14 on the conductor 13, a circuit may be traced through a collector load resistor 15, a junction 16, to the collector 17 of a npn transistor 20, which transistor also includes a base electrode 21 and an emitter electrode 22. The circuit may be further traced from the emitter through a junction 23 and a time adjusting variable emitter resistor 24 to a junction 25 on the negative conductor 12. From the conductor 13 a circuit may be traced through a collector load resistor 27, junction 31, to the collector electrode 32 of another npn transistor 33, which transistor also includes a base electrode 34 and an emitter electrode 35. The emitter electrode 35 is connected by a conductor 36 to the junction 23.

The collector electrodes of each of the npn transistors are cross coupled to the opposite base electrode to provide a bistable circuit in the following manner. A circuit path may be traced from collector 17 to junction 16, through a resistor 40, which is paralleled by a capacitor 41, a conductor 42, a junction 45 and a conductor 46 to the base 34. A similar circuit may be traced from the collector 32 through junction 31, a resistor 50, which is paralleled by a capacitor 51, a conductor 52, a junction 55, and a conductor 56 to a base 21.

Directly connected between the bases 21 and 34, or more exactly, connected between junctions 55 and 45 is the winding of a saturating core inductance toroid T1, which preferably has a substantially rectangular hysteresis loop. Also connected from a junction 60 on the conductor 13 is a resistor 61 the other terminal of which is connected to junction 55. Similarly, from a junction 62 a resistor 63 is connected to the junction 45. Connected between the junction 55 and a junction 64 on the conductor 12 is a tunnel diode 65. Connected between the junction 45 and a junction 66 on the conductor 12 is another tunnel diode 67. One output terminal 70 terminates the conductor 12 and the other output terminal 71 is connected to the junction 31 by a conductor 72.

It will be apparent that the transistors 20 and 33 together with the corresponding components form a bistable circuit. Instability is introduced by the use of the saturating core inductance T1 in the base circuit.

The circuit shown in FIGURE 1 provides for a maximum D.C. timing for a given toroid T1, the bistable characteristics of the tunnel diodes 65 and 67 make this long time cycle possible by producing a usable output step when the D.C. current flowing through the diode is increased by a very small amount due to the reduction of impedance in the toroid T1 when it saturates.

Considering now the specific operation of the circuit during a half cycle when transistor 33 is conductive, a current path may be traced from the positive terminal 10 through conductor 13, resistor 27, conductor 30 through the transistor 33 from collector to emitter, through conductor 36 and the common emitter resistor 24 to negative conductor 12.

The tunnel diodes 65 and 67, respectively, are biased to near peak current by properly choosing the resistors 61 and 63. This near peak current is shown as "bias point" in FIGURE 2. While the circuit is ocillating, one diode will be over the hump while the other is at its predetermined bias point. The magnetizing current for the toroid is also passing through the biased diode.

During this first half cycle of operation, tunnel diode 65 is operating at the indicated bias point of FIGURE 2 while tunnel diode 67 is biased past the peak into its high impedance state which provides sufficient voltage thereacross, in the order of .5 volt or greater which holds on its transistor 33. A further current path can be traced from the junction 14 through resistors 15 and 40, conductor 42 and junction 45 and through the tunnel diode 67 and the paralleled base-emitter path of transistor 33 to conductor 12. Due to the potential differences across the two tunnel diodes 65 and 67, the small magnetizing current flows through the core T1 driving the core slowly towards saturation in a first direction. When saturation of the core is reached the impedance of the inductance T1 drops and the current therethrough tends to increase. The slight increase in current at saturation boosts the current through diode 65 into its high impedance state which turns on its transistor 20, and the resulting regenerative feedback of the bistable circuit shuts transistor 33 off and maintains it off. The charge on capacitor 41 provides the necessary kick to put the diode 67 back into its low impedance state at the switching time.

A second half cycle of operation now commences with current flowing from junction 14 through resistor 15 and through transistor 20 from collector 17 to emitter 22 and through the common emitter resistor 24 to the negative conductor 12. The tunnel diode 65 is now biased over the hump into its high impedance region thereby providing sufficient potential to maintain transistor 20 conductive. With transistor 33 now turned off the potential at point 31 sharply rises in a positive going direction so that the bias current may flow from the conductor 13 through resistors 27 and 50 to the junction 55 and thereby through the tunnel diode and the base-emitter junction of transistor 20. The potential across the toroid T1 is now reversed with terminal 55 being positive with respect to terminal 45. The core now begins its volt-second integration in the reverse direction. Since the tunnel diodes maintain the voltage differential between junctions 55 and 45 substantially identical in either condition of operation of the bistable circuit, the time base of volt-second integration is equal in either direction and the two half cycles are substantially identical. When saturation is reached in the opposite direction the impedance of the toroid again drops and the increased current to tunnel diode 67 causes a reversal of the bistable circuit thereby completing the second half cycle of operation and initiating the beginning of a new cycle.

Many changes and modifications of this invention may become apparent to those who are skilled in the art and I therefore wish it to be understood that I intend to be limited by the scope of the appended claims and not by the specific embodiment of my invention which is disclosed herein for the purpose of illustration.

I claim:

1. Low frequency oscillating timing apparatus comprising: a source of electrical energy; semiconductor bistable switching means comprising first and second semiconductor current control means each having a plurality of electrodes including input, output and control electrodes; circuit means energizing said input and output electrodes from said source to provide current flow through one or the other of said semiconductor current control means dependent upon the state of said bistable switching means; saturable core timing means connected intermediate the control electrode of said first and said second semiconductor current control means for causing said bistable switching means to switch from one to the other of its operating states upon saturation of said core means; and tunnel diode means connected from said saturable core to said source.

2. Low frequency oscillating timing apparatus comprising: a source of electrical energy; semiconductor bistable switching means comprising first and second semiconductor current control means each having a plurality of electrodes including input, output and control electrodes; circuit means energizing said input and output electrodes from said source to provide current flow through one or the other of said semiconductor current control means dependent upon the state of said bistable switching means; saturable core timing means connected intermediate the control electrode of said first and said second semiconductor current control means for causing said bistable switching means to switch from one to the other of its operating states upon saturation of said core means; and first and second tunnel diode means connected, respectively, from said control electrodes to said source for maintaining a predetermined constant potential on said saturable core timing means.

3. Low frequency oscillating timing apparatus comprising: a source of electrical energy; semiconductor bistable switching means comprising first and second semiconductor current control means each having a plurality of electrodes including input, output and control electrodes; circuit means connecting said input and output electrodes to said source; regenerative cross coupling means connected from the output electrode of each of said current control means to the control electrode of the other to maintain current flow through one or the other of said semiconductor current control means dependent upon the state of said bistable switching means; saturable core timing means connected intermediate the control electrode of said first and said second semiconductor current control means for causing said bistable switching means to switch from one to the other of its operating states upon saturation of said core means; and tunnel diode means connected from said saturable core to said source.

4. Low frequency oscillating timing apparatus comprising: a source of electrical energy having first and second terminals; semiconductor bistable switching means comprising first and second semiconductor current control means each having a plurality of electrodes including an input electrode, an output electrode and a control electrode; first circuit means connecting said output electrode of said first and said second current control means to said first terminal; second circuit means connecting said input electrodes to said second terminal; regenerative cross coupled impedance means connected from the output electrode of each of said current control means to the control electrode of the other to maintain current flow through one or the other of said semiconductor current control means dependent upon the state of said bistable switching means; saturable core timing means connected intermediate the control electrode of said first and said second semiconductor current control means for causing said bistable switching means to switch from one to the other of its operating states upon saturation of said core means; and first and second tunnel diode means connected, respectively, from the control electrode of said first and second current control means to said second terminal for maintaining predetermined potentials between said control electrodes and said second terminal whereby a relatively constant magnitude of potential can be maintained across said saturable core timing means.

5. Low frequency oscillating timing apparatus comprising: a source of electrical energy; semiconductor bistable switching means comprising first and second semiconductor current control means each having a plurality of electrodes including an input electrode, an output electrode and a control electrode; first circuit means connecting said source in energizing relation to said input and output electrodes of said first and said second current control means; regenerative cross coupled impedance means connected from the output electrode of each of said current control means to the control electrode of the other to maintain current flow through one or the other of said semiconductor current control means, dependent upon the state of said bistable switching means; saturable core timing means connected to the control electrode of said first and said second semiconductor current control means for causing said bistable switching means to switch from one to the other of its operating states upon saturation of said core means; and first and second tunnel diode means connected, respectively, from the control electrode of said first and second current control means to said source for maintaining predetermined potentials between said control electrodes and said source whereby a relatively constant magnitude of potential can be maintained on said saturable core timing means.

6. Low frequency oscillating timing apparatus comprising: a source of electrical energy; semiconductor bistable switching means comprising first and second semiconductor current control means each having a plurality of electrodes including an input electrode, and output electrode and a control electrode; first circuit means connecting said source in energizing relation to said input and output electrodes of said first and said second current control means to maintain current flow through one or the other of said semiconductor current control means dependent upon the state of said bistable switching means; saturable core timing means connected to the control electrode of said first and said second semiconductor current control means for causing said bistable switching means to switch from one to the other of its operating states upon saturation of said core means; and tunnel diode means connected from at least one of the control electrodes of said first and second semiconductor current control means to said source for maintaining predetermined potentials between said control electrodes and said source.

No references cited.